United States Patent
Jang et al.

(10) Patent No.: US 8,120,518 B2
(45) Date of Patent: Feb. 21, 2012

(54) DIGITAL FEEDFORWARD SIGMA-DELTA MODULATOR IN ANALOG-TO-DIGITAL CONVERTER AND MODULATION METHOD THEREOF

(75) Inventors: Yeong-Shin Jang, Daejeon (KR); Sang-Gug Lee, Daegu (KR); Seung-Tak Ryu, Daejeon (KR)

(73) Assignee: Koren Advanced Institute of Science and Technology, Daejeon (KR)

( * ) Notice: Subject to any disclaimer, the term of this patent is extended or adjusted under 35 U.S.C. 154(b) by 117 days.

(21) Appl. No.: 12/814,533

(22) Filed: Jun. 14, 2010

(65) Prior Publication Data

US 2011/0304491 A1 Dec. 15, 2011

(51) Int. Cl.
*H03M 3/00* (2006.01)
(52) U.S. Cl. ........................................ 341/143; 341/144
(58) Field of Classification Search ........... 341/143–144
See application file for complete search history.

(56) References Cited

U.S. PATENT DOCUMENTS

| | | | | |
|---|---|---|---|---|
| 5,274,375 A * | 12/1993 | Thompson | ..................... | 341/143 |
| 5,742,246 A * | 4/1998 | Kuo et al. | ..................... | 341/143 |
| 6,154,161 A * | 11/2000 | Leme et al. | ..................... | 341/143 |
| 6,304,608 B1 * | 10/2001 | Chen et al. | ..................... | 375/252 |
| 6,362,763 B1 * | 3/2002 | Wang | ........................... | 341/143 |
| 6,400,297 B1 * | 6/2002 | Tucker | ........................ | 341/143 |
| 6,765,520 B1 * | 7/2004 | Chuang et al. | ................ | 341/143 |
| 7,119,608 B2 * | 10/2006 | Doerrer | ....................... | 327/552 |
| 7,167,119 B1 * | 1/2007 | Lei et al. | ........................ | 341/143 |
| 7,176,821 B1 * | 2/2007 | Williams et al. | ............. | 341/143 |
| 7,183,957 B1 * | 2/2007 | Melanson | ..................... | 341/143 |
| 7,446,686 B2 * | 11/2008 | Rueger et al. | ................ | 341/143 |
| 7,936,293 B2 * | 5/2011 | Hamashita | ................... | 341/143 |
| 2005/0275571 A1 | 12/2005 | Bjornsen | | |
| 2008/0272944 A1 | 11/2008 | Zhou et al. | | |

FOREIGN PATENT DOCUMENTS

| | | |
|---|---|---|
| JP | 2005-080404 A | 3/2005 |
| KR | 10-2001-0003899 | 1/2001 |

OTHER PUBLICATIONS

A. Gharbiya, et al., "Fully Digital Feedforward Delta Sigma Modulator", 2005 PhD Research in Microelectronics and Electronics, vol. 1, pp. 97-100, Jul. 25-28, 2005.

\* cited by examiner

*Primary Examiner* — Lam T Mai
(74) *Attorney, Agent, or Firm* — Gifford, Krass, Sprinkle, Anderson & Citkowski, P.C.

(57) ABSTRACT

A digital feedforward sigma-delta modulator in an analog-to-digital converter and its modulation method are disclosed. The modulator changes a feedforward path from an analog domain to a digital domain and processes it. The modulator integrates an analog input by using a plurality of integrators, weights them, quantizes them by using a plurality of quantizers in a digital domain to output digital signals, and then adds up the thusly outputted digital signals by using a digital adder. In case of a continuous time digital feedforward sigma-delta modulator (SDM), a digital signal outputted from the digital adder is weighted and then immediately inputted to the digital adder in the digital domain so as to be subtracted, allowing for digital feedforwarding. Because the feedforward signal is processed in the digital domain, the area occupied by an analog circuit and power consumption can be reduced. Also, because signals are added up in the digital domain, a digital output signal can be immediately used when an excess loop delay needs to be corrected. Thus, because there is no need to convert the digital output signal into an analog signal by using a DAC, the DAC can be omitted.

13 Claims, 4 Drawing Sheets

DIGITAL FEEDFORWARD SIGMA-DELTA MODULATOR IN ANALOG-TO-DIGITAL CONVERTER AND MODULATION METHOD THEREOF

BACKGROUND OF THE INVENTION (a) Field of the Invention

The present invention relates to a sigma-delta modulator (SDM) used in an analog-to-digital converter (ADC) and, more particularly, to a digital feedforward SDM having a feedforward path and a modulation method thereof.

(b) Description of the Related Art

A digital feedforward signal-delta modulator (SDM) used in an analog-to-digital converter (ADC) and other applications is well known in this field. Because such an SDM is easily implemented by using a CMOS process without requiring precise components, it is commonly used especially in an analog-to-digital converter (ADC) or the like.

FIG. 1 is a schematic block diagram showing the structure of the related art discrete time feedforward SDM.

As shown in FIG. 1, in the related art discrete time feedforward SDM, the an analog input signal and analog outputs from integrators 10-1, 10-2, ..., 10-$n$ are multiplied by coefficients $b_0$, $b_1$, $b_2$, ..., $b_n$ by multipliers 20-0, 20-1, 20-2, ..., 20-$n$, which are then inputted to an analog adder 30. The analog adder 30 adds up the analog signals inputted from the multipliers 20-0, 20-1, 20-2, ..., 20-$n$ and outputs an analog added signal. The analog added signal outputted from the analog adder 30 is quantized by a quantizer 40, so as to be outputted as a digital output signal. The digital output signal outputted from the quantizer 40 is converted into an analog signal by a digital-to-analog converter (DAC) 50 so as to be fed back, to which a coefficient $a_1$ is applied by a multiplier 60 so as to be outputted as an analog signal. The analog input signal is subtracted by the analog signal fed back from the multiplier 60 by a subtractor 70, which is then inputted to the integrator 10-1.

With reference to FIG. 1, in the related art discrete time feedforward SDM, the part from the quantizer 40 to the DAC 50 is a digital domain, while the other part, namely, from the analog input signal to the analog adder 30 and from the multiplier 60 to the subtractor 70 is an analog domain.

Thus, the related art discrete time feedforward SDM requires an analog adding circuit such as the analog adder 30 in order to add up the analog signals, and in general, a high speed signal processing is required in the analog adding circuit.

FIG. 2 is a schematic block diagram showing the structure of the related art continuous time feedforward SDM.

As shown in FIG. 2, the related art continuous time feedforward SDM has a very similar structure to that of the discrete time feedforward SDM illustrated in FIG. 1. Thus, the same reference numerals will be used for the same elements as those illustrated in FIG. 1.

The continuous time feedforward SDM illustrated in FIG. 2 additionally includes elements 80 and 90 for correcting an excess loop delay besides the elements 10-1, 10-2, ..., 10-$n$, 20-0, 20-1, 20-2, ..., 20-$n$, 30, 40, 50, 60, and 70 of the related art discrete time feedforward SDM illustrated in FIG. 1. Namely, a digital output signal outputted from the quantizer 40 is converted into an analog signal by a DAC 80, to which a coefficient $a_2$ is multiplied by the multiplier 90 so as to be outputted as an analog signal, and the analog signal is outputted to the analog adder 30 so as to be applied as a subtraction value. Namely, the analog adder 30 illustrated in FIG. 1 adds up only the analog signals outputted from the multipliers 20-0, 20-1, 20-2, ..., 20-$n$, while the analog adder 30 illustrated in FIG. 2 adds up all the analog signals outputted from the multipliers 20-0, 20-1, 20-2, ..., 20-$n$, subtracts an analog signal, which has been converted from a digital output signal outputted from the quantizer 40, weighted, and fed back, from the added analog signal and then outputs the resultant signal to the quantizer.

With reference to FIG. 2, the part from the quantizer 40 to the DACs 50 and 80 is a digital domain, and the other part, namely, from the analog input signal to the analog adder 30, from the multiplier 60 to the subtractor 70, and from the multiplier 90 to the analog adder 30, is an analog domain.

Thus, the related art continuous time feedforward SDM also requires an analog adding circuit such as the analog adder 30 in order to add up the analog signals, and in general, a high speed signal processing is required in such an analog adding circuit. Also, it is noted that, the related art continuous time feedforward SDM additionally uses the DAC 80 for converting the digital output signal to the analog signal in order to correct the excess loop delay.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a digital feedforward sigma-delta modulator (SDM) and its modulation method having advantages of improving activity in circuit designing according to a process by reducing the area of an analog circuit and power consumption.

An exemplary embodiment of the present invention provides a digital feedforward SDM for performing digital feedforward sigma-delta modulation on an analog input signal and outputting a corresponding digital output signal, including: a plurality of integrators connected in series, receiving an analog signal, integrating the received analog signal and outputting a corresponding analog signal, respectively; a plurality of multipliers weighting the analog signals outputted from the plurality of integrators and outputting the weighted analog signals, respectively; a plurality of quantizers performing quantization on the analog signals outputted from the plurality of multipliers and outputting a digital signal, respectively; and a digital adder adding up the digital signals outputted from the plurality of quantizers and outputting a corresponding digital output signal.

Another embodiment of the present invention provides, a digital feedforward SDM for performing digital feedforward sigma-delta modulation on an analog input signal and outputting a corresponding digital output signal, including: a plurality of integrators connected in series, receiving an analog signal, integrating the received analog signal and outputting a corresponding analog signal, respectively; a plurality of multipliers weighting the analog signals outputted from the plurality of integrators and outputting a weighted analog signal, respectively; a plurality of quantizers performing quantization on the analog signals outputted from the plurality of multipliers and outputting a digital signal, respectively; a digital adder adding up the digital signals outputted from the plurality of quantizers, subtracting a signal inputted as a feedback signal from the result of the adding up the digital signals, and outputting a corresponding digital output signal; and a second multiplier weighting the digital signal outputted from the digital adder and outputting the weighted digital signal to the digital adder.

Yet another embodiment of the present invention provides a digital feedforward sigma-delta modulation method for performing digital feedforward sigma-delta modulation on an analog input signal and outputting a corresponding digital output signal, including: inputting an analog input signal to a plurality of integrators connected in series; weighting the analog input signal and analog signals outputted from the plurality of integrators, and outputting corresponding analog signals; quantizing the weighted analog signals and outputting corresponding digital signals; and adding up all the digital signals and outputting a corresponding digital output signal.

Still another embodiment of the present invention provides a digital feedforward sigma-delta modulation method for performing digital feedforward sigma-delta modulation on an analog input signal and outputting a corresponding digital output signal, including: inputting an analog input signal to a plurality of integrators connected in series; weighting the analog input signal and an analog signal outputted from each of the plurality of integrators, and outputting corresponding analog signals; quantizing the weighted analog signals and outputting corresponding digital signals; and adding up all the digital signals and outputting a corresponding digital output signal, and in this case, a signal, fed back after it is obtained by weighting the digital output signal, is applied as a subtraction value when the digital signals are all added up.

According to an exemplary embodiment of the present invention, because the feedforward signal is processed in a digital domain, the area occupied by the analog circuit and power consumption can be reduced.

Also, because signals are added up in the digital domain, a digital output signal can be immediately used when an excess loop delay needs to be corrected. Thus, because there is no need to convert the digital output signal into an analog signal by using a DAC, the DAC can be omitted.

In addition, because the most signal processing can be performed in the digital domain, not in an analog domain, a process development can be achieved, advantageously reducing area and power consumption, and the activity in circuit designing according to the process can be also improved.

DETAILED DESCRIPTION OF THE EMBODIMENTS

Figure 1:
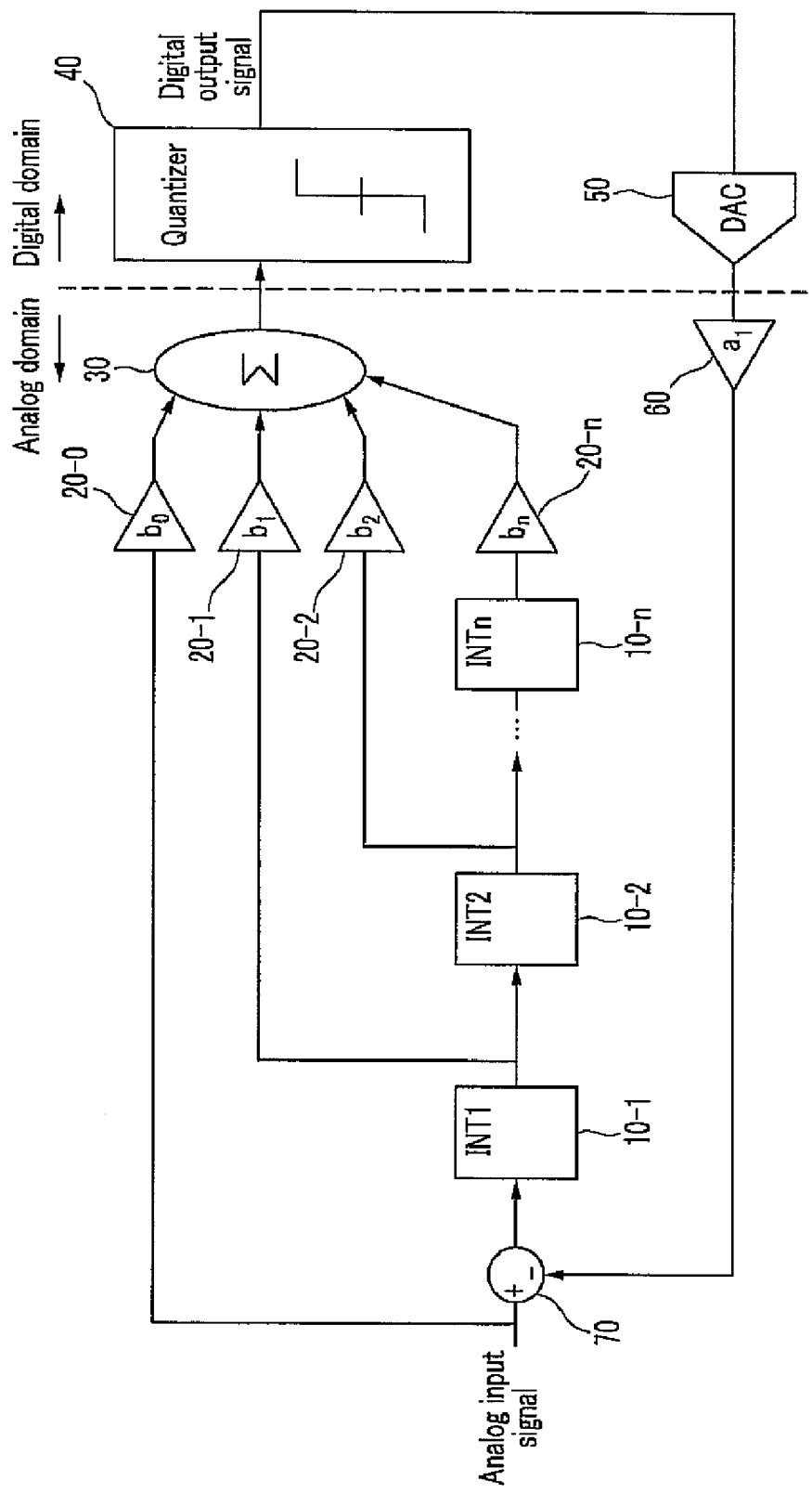
FIG. 1 is a schematic block diagram showing the structure of the related art discrete time feedforward sigma-delta modulator (SDM).

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When a part 'includes' an element, it means that it may include a different element, rather than excluding the different element, unless otherwise specified. Terms such as 'part' or 'unit', 'module' used in the specification refers to a unit for processing at least one function or operation, which may be implemented by hardware, software, or a combination of hardware or software.

Figure 3:
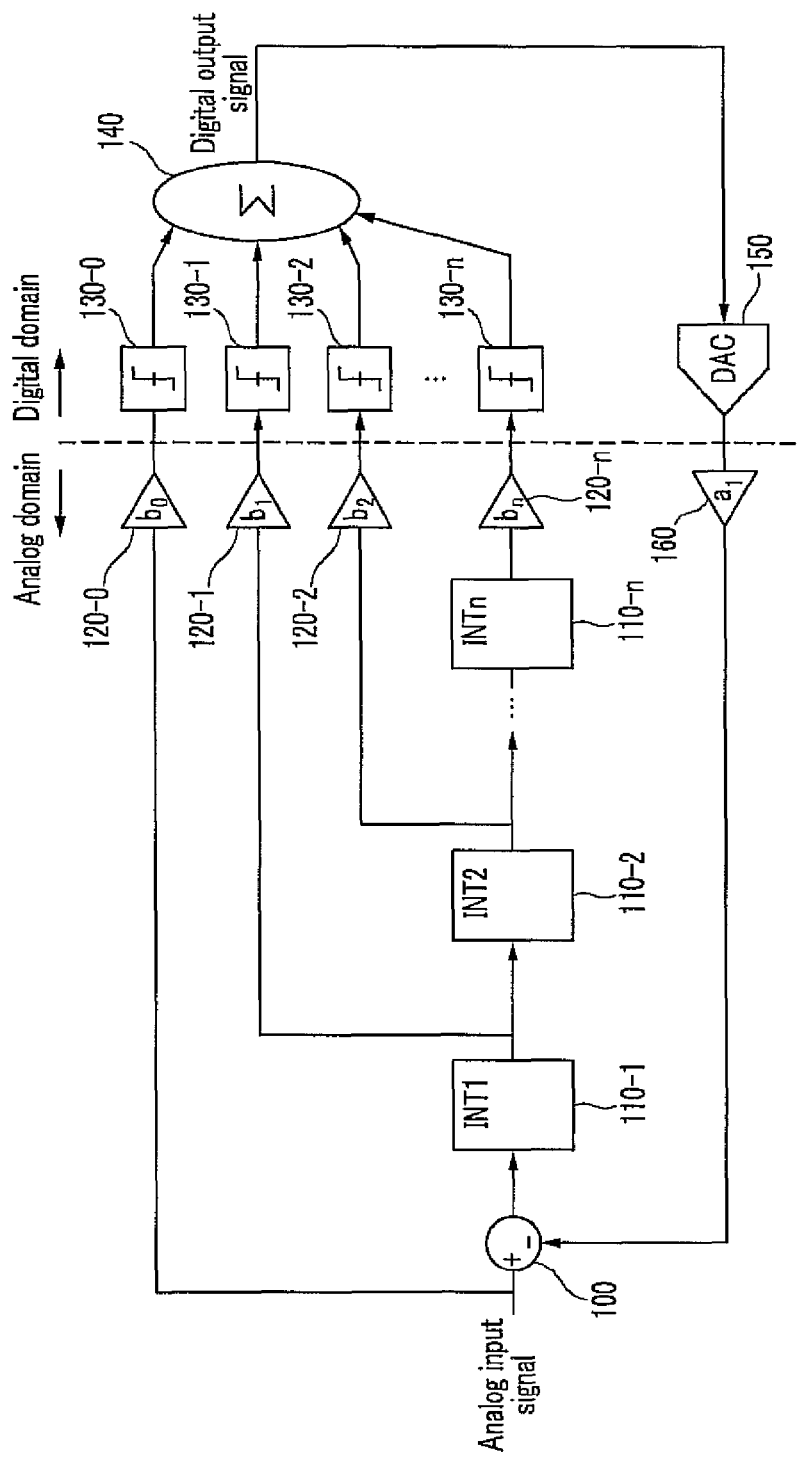
FIG. 3 is a schematic block diagram showing the structure of a discrete time feedforward SDM according to an exemplary embodiment of the present invention.

FIG. 3 is a schematic block diagram showing the structure of a discrete time feedforward SDM according to an exemplary embodiment of the present invention.

As shown in FIG. 3, a digital feedforward SDM according to an exemplary embodiment of the present invention includes a subtractor 100, integrators 110-1, 110-2, ..., 110-$n$, multipliers 120-0, 120-1, 120-2, ..., 120-$n$, 160, quantizers 130-0, 130-1, 130-2, ..., 130-$n$, a digital adder 140, and a digital-to-analog converter (DAC) 150.

The subtractor 100 subtracts an analog signal outputted from a multiplier 160 from an analog input signal, and outputs a resultant signal to the integrator 110-1.

The integrators 110-1, 110-2, ..., 110-$n$ are connected in series. Each integrator receives an output from its front stage, integrates the received signal, and outputs the integrated signal to its rear stage. The first integrator 110-1 of the integrators 110-1, 110-2, ..., 110-$n$ connected in series receives the analog signal outputted from the subtractor 100. The analog signal outputted from the integrator 110-$n$ positioned at the end of the integrators connected in series is inputted to the multiplier 120-$n$.

The analog signals outputted from the integrators 110-1, 110-2, ..., 110-$n$ are inputted to the multipliers 120-1, 120-2, ..., 120-$n$, respectively.

An input to the multiplier 120-0 is an analog input signal.

The multipliers 120-0, 120-1, 120-2, ..., 120-$n$ multiply coefficients $b_0$, $b_1$, $b_2$, to the analog input signal and the analog signals outputted from the integrators 110-1, 110-2, ..., 110-$n$ and output corresponding analog signals to the quantizers 130-0, 130-1, 130-2, ..., 130-$n$, respectively.

The quantizers 130-0, 130-1, 130-2, ..., 130-$n$ perform quantization on the respective analog signals to which the coefficients $b_0$, $b_1$, $b_2$, ..., $b_n$ have been multiplied by the multipliers 120-0, 120-1, 120-2, ..., 120-$n$, and output corresponding digital signals to the digital adder 140.

The digital adder 140 adds up all the digital signals outputted from the quantizers 130-0, 130-1, 130-2, ..., 130-$n$, and output a corresponding digital output signal.

The DAC 150 converts the digital output signal outputted from the digital adder 140 into a corresponding analog signal so as to be fed back to the subtractor 100, and outputs the converted analog signal.

The multiplier 160 multiplies a coefficient $a_1$ to the analog signal outputted from the DAC 150, and feeds the corresponding analog signal to the subtractor 100.

With reference to FIG. 3, roughly, the part from the quantizers 130-0, 130-1, 130-2, ..., 130-$n$ to the digital adder 140 and to the DAC 150 is a digital domain, and the other part, namely, from the analog input signal to the multipliers 120-0, 120-1, 120-2, ..., 120-$n$ and to the multiplier 160, is an analog domain.

Compared with the related art feedforward SDM described above with reference to FIG. 1, in the digital feedforward SDM according to an exemplary embodiment of the present invention described with reference to FIG. 3, the digital adder 140, as a circuit for adding up the signals, belongs to the digital domain.

The operation of the digital feedforward SDM according to an exemplary embodiment of the present invention will now be described.

After a signal fed back from the multiplier 160 is subtracted by the subtractor 100 from the analog input signal, the resultant signal is inputted as an input signal to the first integrator 110-1 among the integrators 110-1, 110-2, . . . , 110-3 connected in series. Also, the analog input signal is inputted to the multiplier 120-0.

Next, the analog signal outputted from the subtractor 100 is integrated serially by the integrators 110-1, 110-2, . . . , 110-3. The respective analog signals outputted from the integrators 110-1, 110-2, . . . , 110-3 are outputted to the multipliers 120-1, 120-2, . . . , 120-n.

The analog signals inputted to the multipliers 120-0, 120-1, 120-2, . . . , 120-n are weighted by the coefficients $b_0$, $b_1$, $b_2$, . . . , $b_n$, which are then outputted as corresponding analog signals.

In this manner, the analog signals outputted from the multipliers 120-0, 120-1, 120-2, . . . , 120-n of the analog domain are transferred to the digital domain and inputted to the quantizers 130-0, 130-1, 130-2, . . . , 130-n.

The respective analog signals are then quantized by the quantizers 130-0, 130-1, 130-2, 130-n, and outputted as digital signals to the digital adder 140.

And then, the digital signals inputted to the digital adder 140 are all added up and outputted as a corresponding digital output signal. That is, the digital adder 140 only adds up the digital signals on the digital domain.

Thereafter, the digital output signal outputted from the digital adder 140 is converted into a corresponding analog signal by the DAC 150 so as to be fed back to the analog domain, weighted by the coefficient $a_1$ in the multiplier 160, and then fed back to the subtractor 100.

As described above, the digital feedforward SDM according to an exemplary embodiment of the present invention digitalizes the feedforward path, allowing for shifting the signal processing part, which is performed in the analog domain in the related art, to the digital domain, and accordingly, only the digital adding circuit is used on the digital domain without using a high speed analog adding circuit, thus reducing the area otherwise occupied by the analog circuit or its power consumption.

Figure 4:
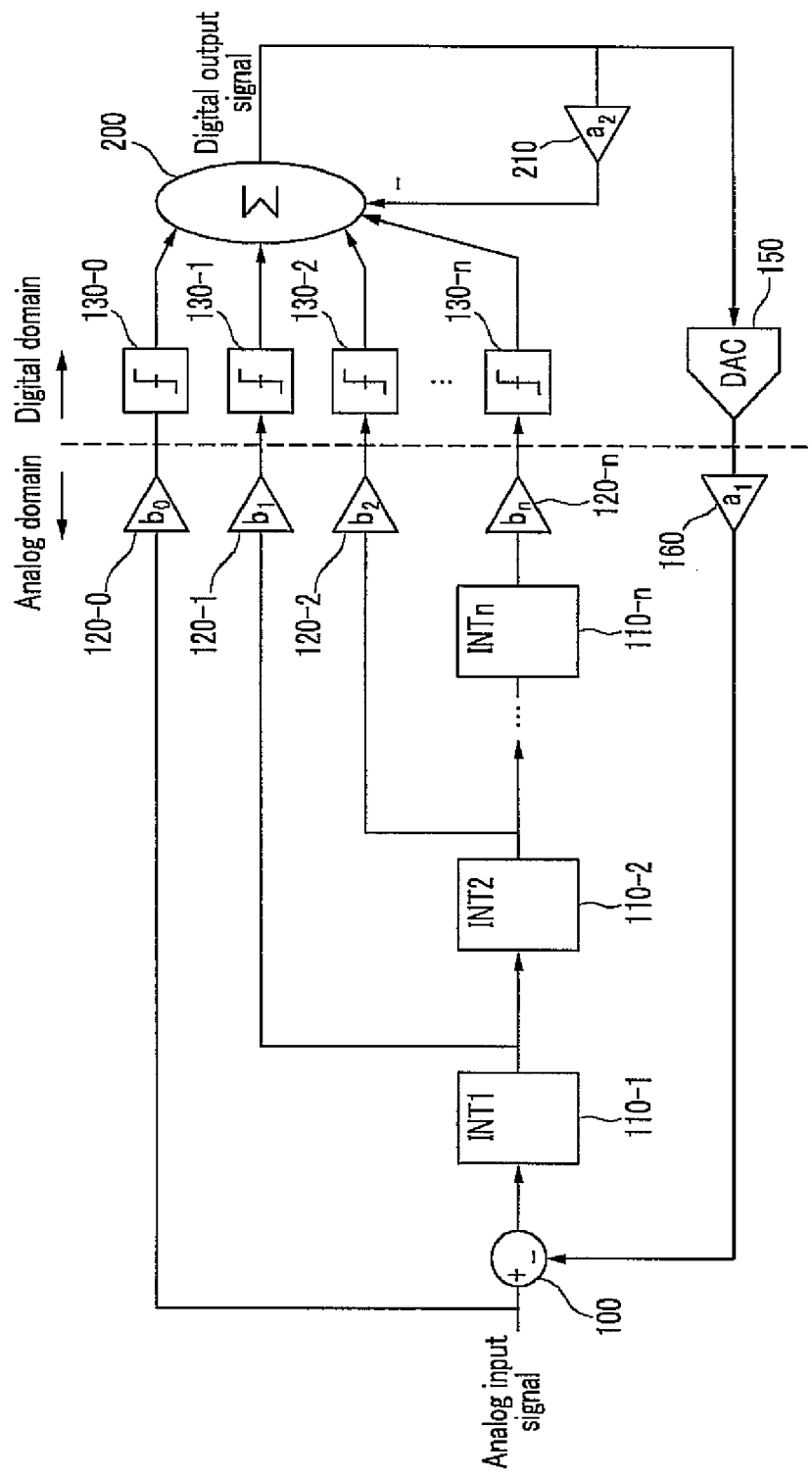
FIG. 4 is a schematic block diagram showing the structure of a continuous time feedforward SDM according to an exemplary embodiment of the present invention.

FIG. 4 is a schematic block diagram showing the structure of a continuous time feedforward SDM according to an exemplary embodiment of the present invention. The continuous time digital feedforward SDM illustrated in FIG. 4 has a similar configuration to that of the discrete time digital feedforward SDM illustrated in FIG. 3, so the same reference numerals are used for the same elements as those illustrated in FIG. 3.

As shown in FIG. 4, the continuous time digital feedforward SDM according to an exemplary embodiment of the present invention includes a subtractor 100, integrators 110-1, 110-2, . . . , 110-n, multipliers 120-0, 120-1, 120-2, . . . , 120-n, 160, quantizers 130-0, 130-1, 130-2, . . . , 130-n, a digital adder 200, and a digital-to-analog converter (DAC) 150.

The continuous time digital feedforward SDM illustrated in FIG. 4 has a similar configuration to that of the discrete time digital feedforward SDM illustrated in FIG. 3, so, here, only the different parts from those of the discrete time digital feedforward SDM illustrated in FIG. 3 will be described.

In the continuous time digital feedforward SDM, an excessive loop delay needs to be corrected, so a multiplier 210 is added to the discrete time digital feedforward SDM illustrated in FIG. 3 and the digital adder 200 applies a digital signal outputted from the multiplier 210 for a subtraction.

Namely, the multiplier 210 multiplies a digital output signal outputted from the digital adder 200 by a coefficient a2, and outputs the resultant signal to the digital adder 200. Here, because the digital adder 200 exists in the digital domain, a signal fed forward to the digital adder 200 does not need to be converted into an analog signal.

In addition, the digital adder 200 adds up all the digital signals outputted from the quantizers 130-0, 130-1, 130-2, . . . , 130-n, and additionally subtracts the digital signal outputted from the multiplier 210, and outputs a corresponding digital output signal.

Figure 2:
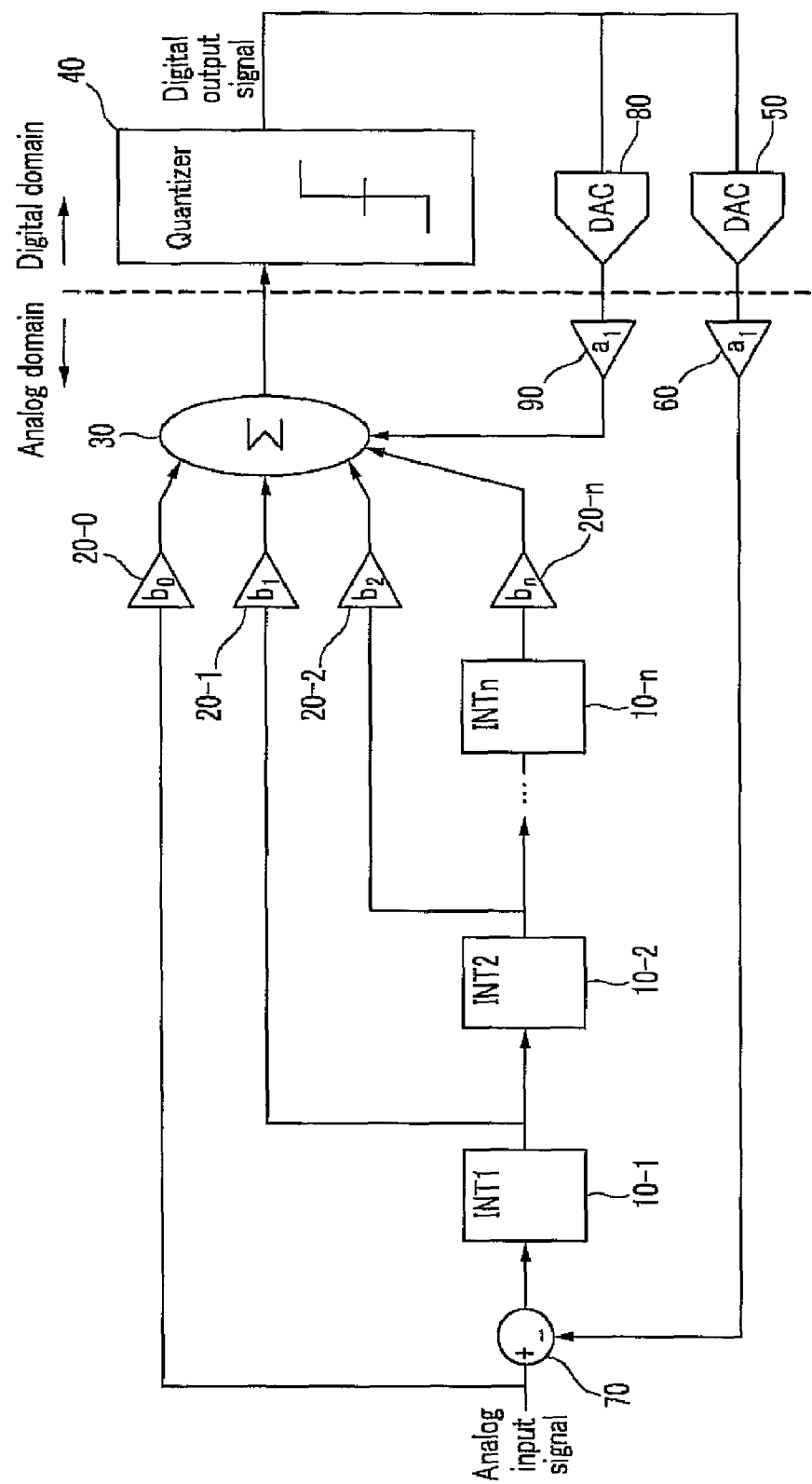
FIG. 2 is a schematic block diagram showing the structure of the related art continuous time feedforward SDM.

Compared with the related art feedforward SDM described above with reference to FIG. 2, in the digital feedforward SDM according to an exemplary embodiment of the present invention described with reference to FIG. 4, the digital adder 200, as a circuit for adding up the signals, belongs to the digital domain. In addition, in the related art feedforward SDM described above with reference to FIG. 2, the DAC is used to correct the excessive loop delay, but in the digital feedforward SDM according to the exemplary embodiment illustrated in FIG. 4, because the digital adder 200 is positioned in the digital domain, only the coefficient $a_2$ can be simply multiplied to the digital output signal outputted from the digital adder 200 through the multiplier 210, which is then inputted as a digital signal to the digital adder 200, in order to correct the excessive loop delay, so there is no need to use a DAC.

The operation of the continuous time digital feedforward SDM according to an exemplary embodiment of the present invention illustrated in FIG. 4 is very similar to the discrete time digital feedforward SDM illustrated in FIG. 3. That is, the digital output signal outputted from the digital adder 200 is weighted by the coefficient $a_2$ in the multiplier 210, which is then feedforward to the digital adder 200, and when all the digital signals outputted from the quantizers 130-0, 130-1, 130-2, . . . , 130-n are added up by the digital adder 200, the digital signal outputted from the multiplier 210 is applied to the digital adder 210 such that it is subtracted from all the digital signals outputted from the quantizers 130-0, 130-1, 130-2, . . . , 130-n, and as a result, an excessive loop delay with respect to the digital output signal can be corrected.

As described above, the continuous time digital feedforward SDM according to an exemplary embodiment of the present invention digitalizes the feedforward path, allowing for shifting the signal processing part, which is performed in the analog domain in the related art, to the digital domain, and accordingly, only the digital adding circuit is used on the digital domain without using a high speed analog adding circuit, thus reducing the area otherwise occupied by the analog circuit or its power consumption.

Also, because the digital adder 200 used for correcting the excessive loop delay is positioned in the digital domain, not in the analog domain, the digital output signal can be simply weighted by the coefficient $a_2$ in the multiplier 210, without being converted into an analog signal, and then immediately applied to the digital adder 200, removing the necessity of the use of a DAC. Accordingly, the area otherwise occupied by an analog circuit and its power consumption can be further reduced.

Meanwhile, the digital feedforward SDMs according to the exemplary embodiments of the present invention described with reference to FIGS. 3 and 4 are illustrated to use many quantizers 130-0, 130-1, 130-2, . . . , 130-n, but actually, in consideration of a low swing range of the outputs of the integrators 110-1, 110-2, . . . , 110-n, the advantage of the feedforward structure, a significantly small number of quantizers, not as much as the actually required resolution, is required. For example, when a 4-bit quantizer is desired to be implemented, the related art feedforward SDMs illustrated in FIGS. 1 and 2 generally use fifteen comparators for one quantizer, and the digital feedforward SDMs according to the exemplary embodiments of the present invention illustrated in FIGS. 3 and 4 may also use fifteen comparators or smaller for each quantizer, so the total number of comparators is similar.

Meanwhile, in the above description, the discrete time digital feedforward SDM and the continuous time digital feedforward SDM are separately configured as shown in FIGS. 3 and 4. In this respect, however, in the continuous time digital feedforward SDM, the coefficient $a_2$ of the multiplier 210 may be set to be 0 to cut off the connection of the signal fed forward to the discrete digital adder 200, whereby the continuous time digital feedforward SDM can operate like the discrete time digital feedforward SDM. In this case, because the continuous time digital feedforward SDM according to the present exemplary embodiment feeds forward the digital output signal to the digital adder 200 without using a DAC, even when the coefficient of the multiplier 210 is set to be 0 so as to be implemented as a discrete time digital feedforward SDM, only the multiplier 210 is not in use, so a smaller number of components are used compared with the related art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A digital feedforward sigma-delta modulator (SDM) for performing digital feedforward sigma-delta modulation on an analog input signal and outputting a corresponding digital output signal, the modulator comprising:
a plurality of integrators connected in series, receiving an analog signal, integrating the received analog signal and outputting a corresponding analog signal, respectively;
a plurality of multipliers weighting the analog signals outputted from the plurality of integrators and outputting the weighted analog signals, respectively;
a plurality of quantizers performing quantization on the analog signals outputted from the plurality of multipliers and outputting a digital signals, respectively; and
a digital adder adding up the digital signals outputted from the plurality of quantizers and outputting a corresponding digital output signal.

2. A digital feedforward sigma-delta modulator (SDM) for performing digital feedforward sigma-delta modulation on an analog input signal and outputting a corresponding digital output signal, the modulator comprising:
a plurality of integrators connected in series, receiving an analog signal, integrating the received analog signal and outputting a corresponding analog signal, respectively;
a plurality of multipliers weighting the analog signals outputted from the plurality of integrators and outputting a weighted analog signal, respectively;
a plurality of quantizers performing quantization on the analog signals outputted from the plurality of multipliers and outputting a digital signals, respectively;
a digital adder adding up the digital signals outputted from the plurality of quantizers, subtracting a signal inputted as a feedback signal from the result of the adding up the digital signals, and outputting a corresponding digital output signal; and
a second multiplier weighting the digital signal outputted from the digital adder and outputting the weighted digital signal to the digital adder.

3. The modulator of claim 1, further comprising:
a digital-to-analog converter converting the digital output signal outputted from the digital adder into an analog signal;
an additional multiplier weighting the analog signal outputted from the digital-to-analog converter, and outputting the weighted analog signal; and
a subtractor subtracting the analog signal outputted from the additional multiplier, from an analog signal inputted to a first integrator positioned at the forefront among the plurality of integrators connected in series, and inputting it as an analog input signal of the first integrator.

4. The modulator of claim 2, further comprising:
a digital-to-analog converter converting the digital output signal outputted from the digital adder into an analog signal;
an additional multiplier weighting the analog signal outputted from the digital-to-analog converter, and outputting the weighted analog signal; and
a subtractor subtracting the analog signal outputted from the additional multiplier, from an analog signal inputted to a first integrator positioned at the forefront among the plurality of integrators connected in series, and inputting it as an analog input signal of the first integrator.

5. The modulator of claim 3, wherein the plurality of multipliers multiply a pre-set coefficient to the analog input signal inputted to the first integrator and the analog signals outputted from the plurality of integrators to weight the signals, and outputs the respective signals.

6. The modulator of claim 4, wherein the plurality of multipliers multiply a pre-set coefficient to the analog input signal inputted to the first integrator and the analog signals outputted from the plurality of integrators to weight the signals, and outputs the respective signals.

7. The modulator of claim 5, wherein the number of the plurality of quantizers is equal to the number of the plurality of multipliers.

8. The modulator of claim 6, wherein the number of the plurality of quantizers is equal to the number of the plurality of multipliers.

9. The modulator of claim 2, wherein the second multiplier weights the digital signal outputted from the digital adder by multiplying a particular coefficient to the digital signal, and when the particular coefficient is set to be 0, the digital feedforward SDM operates as a discrete time digital feedforward SDM, and when the particular coefficient is set a value other than 0, the digital feedforward SDM operates as a continuous time digital feedforward SDM.

10. A digital feed-forward sigma-delta modulation method for performing digital feed-forward sigma-delta modulation on an analog input signal and outputting a corresponding digital output signal, the method comprising:
inputting an analog input signal to a plurality of integrators connected in series;
weighting the analog input signal and an analog signal outputted from each of the plurality of integrators, and outputting corresponding analog signals;
quantizing by plurality quantizers the weighted analog signals and outputting corresponding digital signals; and
adding up the digital signals and outputting a corresponding digital output signal.

11. A digital feed-forward sigma-delta modulation method for performing digital feed-forward sigma-delta modulation on an analog input signal and outputting a corresponding digital output signal, the method comprising:
- inputting an analog input signal to a plurality of integrators connected in series;
- weighting the analog input signal and analog signals outputted from the plurality of integrators, and outputting corresponding analog signals;
- quantizing by plurality quantizers the weighted analog signals and outputting corresponding digital signals; and
- adding up all the digital signals and outputting a corresponding digital output signal, and in this case, a signal, fed back after it is obtained by weighting the digital output signal, is applied as a subtraction value when the digital signals are all added up.

12. The method of claim 7, wherein, in inputting the analog input signal to the plurality of integrators, a value obtained by converting the digital output signal into an analog signal and weighting the same is subtracted from the analog input signal, and the resultant analog input signal is inputted to the plurality of integrators.

13. The method of claim 8, wherein, in inputting the analog input signal to the plurality of integrators, a value obtained by converting the digital output signal into an analog signal and weighting the same is subtracted from the analog input signal, and the resultant analog input signal is inputted to the plurality of integrators.

\* \* \* \* \*